(12) United States Patent
Zheng et al.

(10) Patent No.: US 6,366,168 B1
(45) Date of Patent: Apr. 2, 2002

(54) EFFICIENT GROUND NOISE AND COMMON-MODE SUPPRESSION NETWORK

(75) Inventors: Zhiliang Zheng, San Jose; Steven Lam, Cupertino, both of CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 09/528,314

(22) Filed: Mar. 20, 2000

(51) Int. Cl.[7] .................................................. H03F 3/45
(52) U.S. Cl. .......................... 330/253; 330/258; 327/65; 327/89
(58) Field of Search ................................. 330/253, 258, 330/261; 327/65, 72, 77, 81, 89, 359, 563

(56) References Cited

U.S. PATENT DOCUMENTS

| | | | |
|---|---|---|---|
| 4,578,647 A | * 3/1986 | Sasamura | 330/253 |
| 4,777,451 A | * 10/1988 | Tohyama | 330/253 |
| 4,780,687 A | * 10/1988 | Ducourant | 330/253 |
| 4,808,944 A | * 2/1989 | Taylor | 330/253 |
| 5,001,439 A | * 3/1991 | Lopata et al. | 330/253 |
| 5,006,816 A | * 4/1991 | Koide | 330/253 |
| 5,068,621 A | * 11/1991 | Hayward et al. | 330/253 |
| 5,530,401 A | * 6/1996 | Cao et al. | 327/563 |

OTHER PUBLICATIONS

Schilling et al., "Electronic circuits", pp. 162–163, 330–339, 1989.*
Aragones et al., "Experimental Comparison of Substrate Noise Coupling Using Different Wafer Types", IEEE Journal of Solid State Circuits, vol. 34, No. 10, Oct. 1999.
*The Circuits and Filters Handbook*, edited by Wai–Kai Chen (University of Illinois, Chicago, Illinois), pp. 1509–1570.
http://ece–www.colorado.edu/~bart/book/mintro.htm, by Bart J. Van Zeghbroeck, 1998.

* cited by examiner

*Primary Examiner*—Tuan T. Lam
(74) *Attorney, Agent, or Firm*—Eric B. Janofsky

(57) ABSTRACT

A CMOS differential amplifier is provided comprising a current supply coupled to a first terminal of a power supply. A first CMOS transistor is provided having a first source, a first gate, and a first drain coupled to the current supply. A second CMOS transistor is also provided having a second source, a second gate, and a second drain coupled to the current supply. The first and second gates are inputs to the CMOS differential amplifier. A resistance is coupled between a second terminal of the power supply and the first source of the first transistor and the second source of the second transistor to improve common-mode and ground noise suppression.

2 Claims, 5 Drawing Sheets

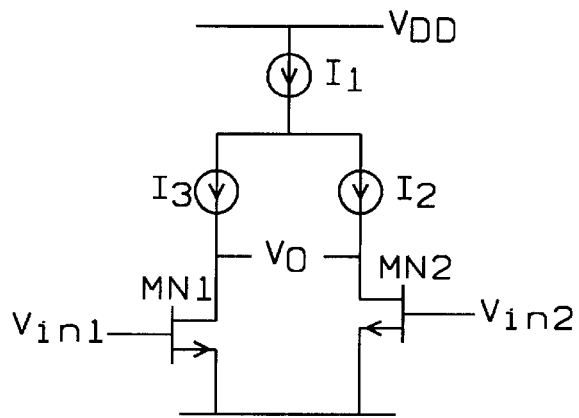
*FIG. 1 - Prior Art*
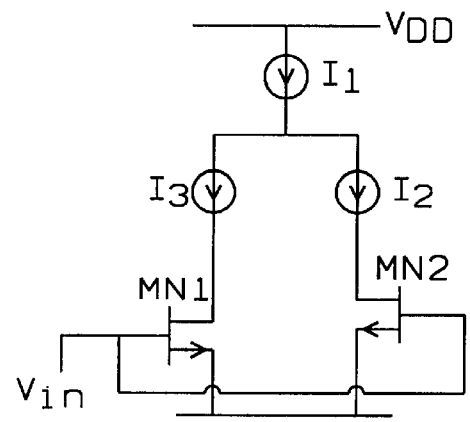
*FIG. 1A - Prior Art*
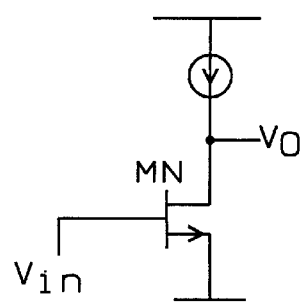
*FIG. 1B - Prior Art*

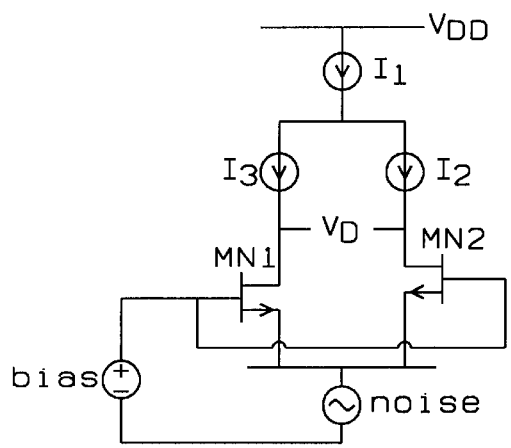
*FIG. 1C — Prior Art*
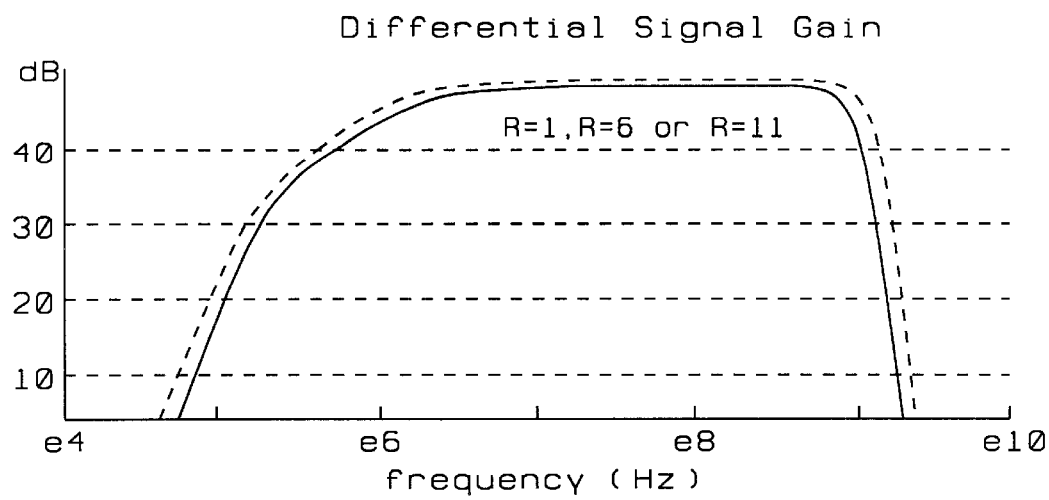
*FIG. 2A*

US 6,366,168 B1

EFFICIENT GROUND NOISE AND COMMON-MODE SUPPRESSION NETWORK

BACKGROUND OF THE INVENTION

1. Field of the Invention

This invention relates generally to a CMOS differential amplifier. More particularly, the present relates to a CMOS differential amplifier and method embodied therein in which ground noise and common mode suppression are improved.

2. Description of the Related Art

In general, differential amplifiers require the amplification of differential voltages, in the presence of fluctuating common-mode voltages. Since the desired signal is usually the differential voltage, the response to the common-mode signal produces an error at the output that is indistinguishable from the signal. FIG. 1 is a circuit diagram of a conventional CMOS differential amplifier comprising transistors $MN_1$ and $MN_2$, which are substantially the same size. As shown therein, the differential amplifier comprises a pair of differential inputs $V_{in1}$ and $V_{in2}$ to transistors $MN_1$ and $MN_2$, respectively. A current source $I_1$ is connected between $V_{dd}$ of a power supply and first terminals of current sources $I_2$ and $I_3$. The other terminal of current source $I_2$ is connected to the drain of transistor $MN_1$, and the other terminal of current source $I_3$ is connected to the drain of transistor $MN_2$. The sources of transistors $MN_1$ and $MN_2$ are connected to the other terminal of the power supply.

FIG. 1A shows the conventional circuit of FIG. 1 in common mode. In other words, the inputs of transistors $MN_1$ and $MN_2$ are connected to a common voltage source. The conventional CMOS differential amplifier is susceptible to insufficient common mode rejection or suppression. The equivalent circuit of FIG. 1A is shown in FIG. 1B, and the output voltage $V_o$ is equal to $(V_{in}-V_T) \cdot A$, where $V_T$ is the threshold voltage and A is the gain. FIGS. 2A and 2B illustrates the differential signal gain response and common-mode gain response, respectively, of the conventional CMOS differential amplifier.

CMOS differential amplifiers are also susceptible to ground noise. Ground noise may be due to, among other factors, digital switching devices inducing currents to the substrate through the depletion capacitances of the device in p-n junctions. In general, the amount of noise injected will be larger the larger the device, and the faster the transients. Argones and Rubio *Experimental Comparison of Substrate Noise coupling Using Different Wafer Types*, IEEE Journal of Solid State Circuits, Vol. 34, No. 10, October 1999 provides a more detailed discussion of substrate (ground) noise, the contents of which are herein incorporated by reference. FIG. 1C is a schematic diagram illustrating noise being injected through the ground node. FIG. 2B illustrates the response of ground noise gain of the conventional CMOS differential amplifier.

OBJECTS OF THE INVENTION

Therefore, it is an object of the present invention to overcome the aforementioned problems.

It is another object of the present invention to provide a CMOS differential amplifier with improved common mode rejection.

It is a further object of the present invention to provide a CMOS differential amplifier with improved ground noise rejection.

SUMMARY OF THE INVENTION

According to this invention, a CMOS differential amplifier comprises a current supply coupled to a first terminal of a power supply. A first CMOS transistor has a first source, a first drain and a first gate, the first drain being coupled to the current supply. A second CMOS transistor has a second source, a second drain and a second gate, the second drain being coupled to the current supply, and the first and second gates being inputs to the CMOS differential amplifier. A resistance is coupled between a second terminal of the power supply and the first source of the first transistor and the second source of the second transistor.

In accordance with a second aspect of the present invention, the current supply comprises a first current source coupled to the first terminal of the power supply, a second current source coupled to the first current source and the first drain of the first CMOS transistor, and a third current source coupled to the first current source and the second drain of the second CMOS transistor.

In accordance with a third aspect of the present invention, the resistance is greater than 6 ohms.

In accordance with a fourth aspect of the present invention, a method of forming a CMOS differential amplifieri is provided and comprises the step of forming a current supply on a substrate in which the current supply is coupled to a first terminal of a power supply. A first CMOS transistor is formed on the substrate having a first source, a first drain and a first gate, in which the first drain is coupled to the current supply. A second CMOS transistor is formed on the substrate having a second source, a second drain and a second gate, the first and second gates being inputs to the CMOS differential amplifier in which the second drain is coupled to the current supply. A resistance is provided between a second terminal of the power supply and the first source of the first transistor and the second source of the second transistor.

In accordance with a fifth aspect of the present invention, the resistance is selected to be greater than 6 ohms.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

FIG. 1 is a schematic diagram of a conventional CMOS differential amplifier;

FIG. 1A is a schematic diagram of the conventional CMOS differential amplifier arranged in common mode;

FIG. 1B is a schematic diagram of an equivalent circuit of the conventional CMOS differential amplifier arranged in common mode;

FIG. 1C is a schematic diagram modeling ground noise being injected in the conventional CMOS differential amplifier;

FIG. 2A is a graph illustrating the differential signal gain of the conventional CMOS differential amplifier as compared to the CMOS differential amplifier in accordance with the present invention;

DESCRIPTION OF THE PREFERRED EMBODIMENTS

Reference is now made to FIGS. 3, 3A, 3B and FIG. 3C. Shown therein is the preferred embodiment of the present invention.

Figure 3:
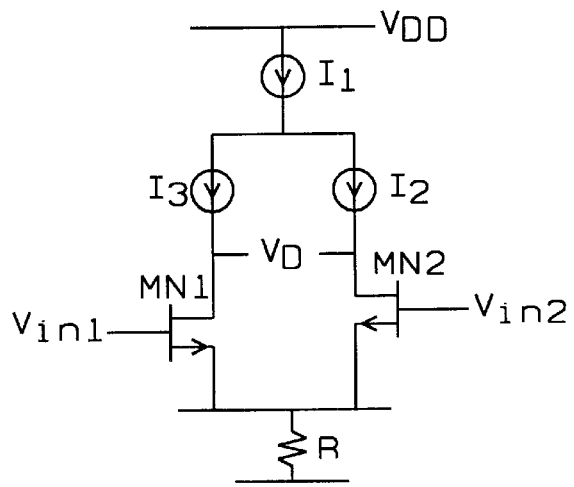
FIG. 3 is a schematic diagram of a CMOS differential amplifier in accordance with the present invention.

FIG. 3 is a circuit diagram of a CMOS differential amplifier in accordance with the preferred embodiment of the present invention and comprises NMOS transistors $MN_1$ and $MN_2$, which are substantially the same size. As shown therein, the differential amplifier comprises a pair of differential inputs $V_{in1}$ and $V_{in2}$ to transistors $MN_1$ and $MN_2$, respectively. A current source $I_1$ is connected between $V_{dd}$ of a power supply (not shown) and first terminals of current sources $I_2$ and $I_3$. The other terminal of current source $I_2$ is connected to the drain of transistor $MN_1$, and the other terminal of current source $I_3$ is connected to the drain of transistor $MN_2$. The sources of transistors $MN_1$ and $MN_2$ are connected through a resistance R to the other terminal of the power supply. Current source $I_1$, $I_2$, and $I_3$ form a current supply.

Figure 3A:
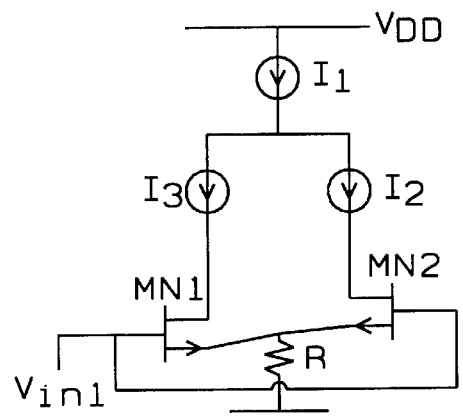
FIG. 3A is a schematic diagram of the CMOS differential amplifier of FIG. 3 arranged in common mode.
Figure 3B:
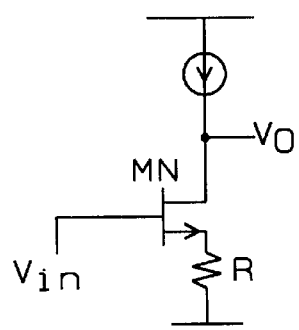
FIG. 3B is a schematic diagram of an equivalent circuit of the CMOS differential amplifier of FIG. 3 arranged in common mode.

FIG. 3A shows the preferred embodiment shown in FIG. 1 connected in common mode. The equivalent circuit of FIG. 3A is shown in FIG. 3B, and the output voltage $V_o$ is equal to $(V_{in}-V_1-V_T) \cdot A$, where $V_T$ is the threshold voltage, $V_1$ is the voltage across the resistance and A is the gain. A comparison of the output voltages between the preferred embodiment and the conventional CMOS differential amplifier can be express as follows:

$$|(V_{in}-V_1-V_T)| < |(V_{in}-V_T)| \quad (1)$$

As can be appreciated by one of ordinary skill in the art, equation (1) illustrates that the common mode response has been degenerated or suppressed by an amount $V_1$.

Figure 2B:
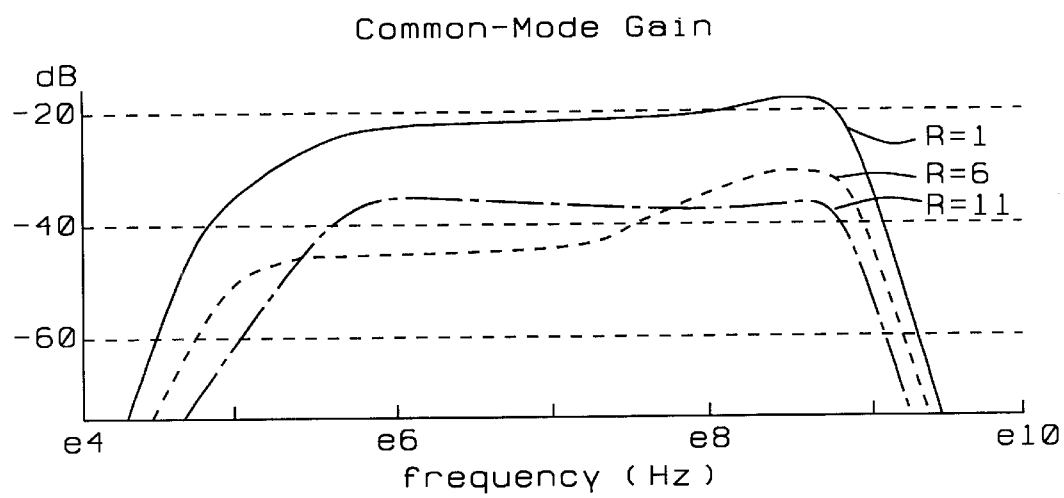
FIG. 2B is a graph illustrating the common-mode gain of the conventional CMOS differential amplifier as compared to the CMOS differential amplifier in accordance with the present invention.

FIGS. 2A and 2B illustrates the differential signal gain response and common-mode gain response, respectively, of the CMOS differential amplifier in accordance with the present invention with R having values of 6 ohms and 11 ohms. As can be seen in FIG. 2A, the differential signal gain response at 6 ohms or 11 ohms is generally the similar to the conventional CMOS differential amplifier throughout the frequency range of interest. Referring to FIG. 2B, the common mode gain is shown, in which there is an improvement of approximately 20 dB throughout the frequency range of interest.

Figure 3C:
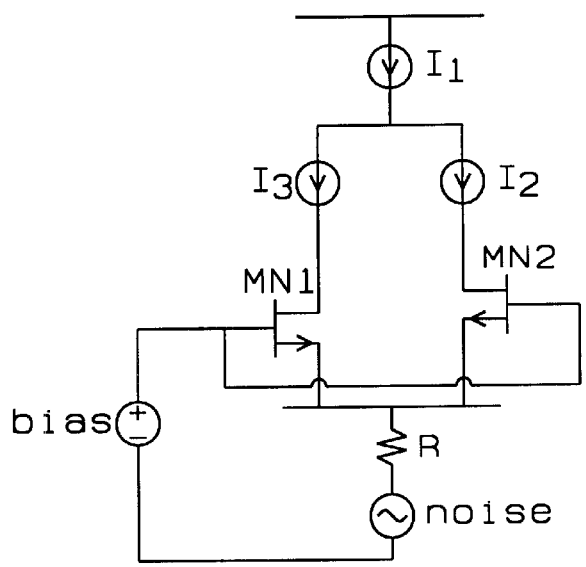
FIG. 3C is a schematic diagram modeling ground noise being injected in the CMOS differential amplifier of FIG. 3.

FIG. 3C is a schematic representation to model ground noise. As shown therein, the inputs are connected in common mode to a bias voltage supply and a noise signal is injected through the resistance R.

Figure 2C:
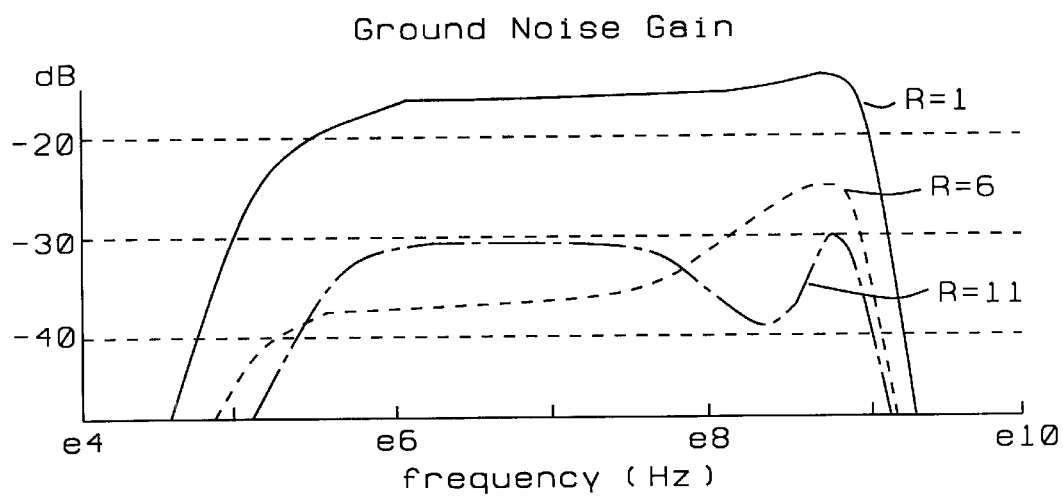
FIG. 2C is a graph illustrating the ground noise gain of the conventional CMOS differential amplifier as compared to the CMOS differential amplifier in accordance with the present invention.

FIG. 2C is a graph illustrating the ground noise gain for both a resistance of 6 ohms and one of 11 ohms as compared to the conventional CMOS differential amplifier. As is readily apparent, the present invention has approximately 15 to 20 dB improvement in ground noise gain over the conventional CMOS differential amplifier.

The value of resistance can be selected as follows $$R=V_s/I, \quad (2)$$

where $V_s$ is the source voltage, and I is the current through the resistance R. For example if $V_s$=240 mv and I=30 ma then R should preferably be 8 ohms, or if 200 mv and I=1 ma then R should preferably be 200 ohms.

Figure 4:
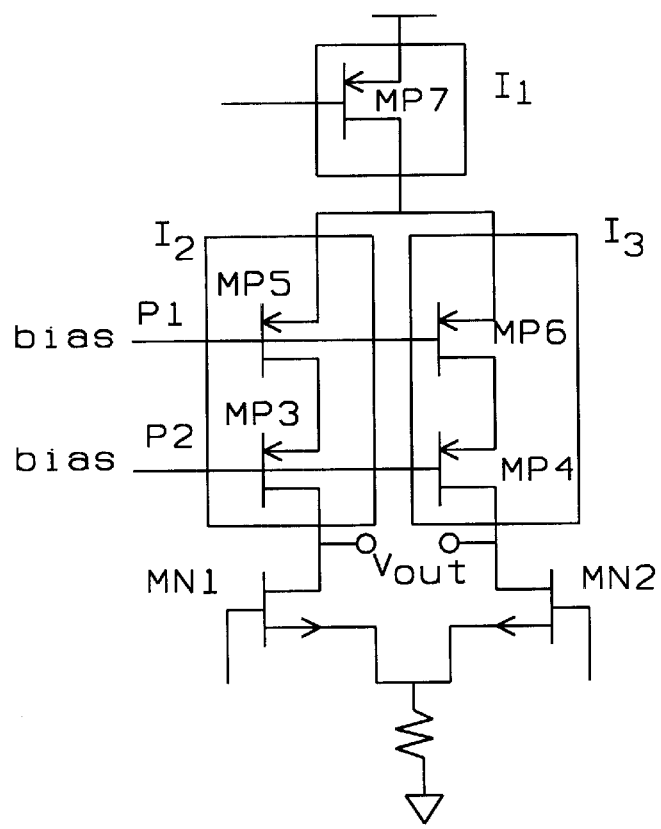
FIG. 4 is a more detail schematic diagram of the CMOS differential amplifier of FIG. 3.

FIG. 4 is an alternate embodiment of the present invention. As shown therein, current source $I_1$ can be implemented by PMOS transistor $MP_7$. While current source $I_2$ can be implemented as PMOS transistors $MP_3$ and $MP_5$. Similarly current source $I_3$ can be implemented as PMOS transistors $MP_4$ and $MP_6$. As will be appreciated by one of ordinary skill in the art the implementation of current sources described above was shown only example purposes. As such, other appropriate CMOS current source configurations may be employed instead of the ones illustrated in FIG. 4.

Moreover, as will be understood by one of ordinary skill in the art, while the preferred embodiment is described with NMOS transistors $MN_1$, $MN_2$ and PMOS transistors $MP_3$, $MP_4$, $MP_3$, $MP_5$, and $MP_7$, the polarities may be reversed.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An MOS differential amplifier comprising:

a current supply coupled to a first terminal of a power supply;

a first MOS transistor having a first source, a first drain and a first gate, said first drain being coupled to said current supply;

a second MOS transistor having a second source, a second drain and a second gate, said second drain being coupled to said current supply, and said first and second gates being inputs to the MOS differential amplifier; and a resistance coupled between a second terminal of the power supply and said first source of said first transistor and said second source of said second transistor, and wherein said resistance is greater than or equal to approximately 6 ohms and less than or equal to approximately 11 ohms.

2. A method of forming an MOS differential amplifier comprising the steps of:

forming a current supply on a substrate;

coupling the current supply to a first terminal of a power supply;

forming a first MOS transistor on the substrate having a first source, a first drain and a first gate;

coupling the first drain to the current supply;

forming a second MOS transistor on the substrate having a second source, a second drain and a second gate, the first and second gates being inputs to the MOS differential amplifier;

coupling the second drain to the current supply;

providing resistance between a second terminal of the power supply and the first source of the first transistor and the second source of the second transistor; and selecting the resistance to be greater than or equal to approximately 6 ohms and less than or equal to approximately 11 ohms.

* * * * *